US005600597A

United States Patent [19]
Kean et al.

[11] Patent Number: 5,600,597
[45] Date of Patent: Feb. 4, 1997

[54] REGISTER PROTECTION STRUCTURE FOR FPGA

[75] Inventors: Thomas A. Kean; William A. Wilkie, both of Edinburgh, Scotland

[73] Assignee: Xilinx, Inc., San Jose, Calif.

[21] Appl. No.: 486,176

[22] Filed: Jun. 6, 1995

[30] Foreign Application Priority Data

May 2, 1995 [GB] United Kingdom .................. 9508931
May 2, 1995 [GB] United Kingdom .................. 9508934

[51] Int. Cl.⁶ ............................................... G11C 7/00
[52] U.S. Cl. ...................... 365/189.08; 326/38; 377/28
[58] Field of Search ..................... 365/189.08; 326/38, 326/39; 377/28

[56] References Cited

U.S. PATENT DOCUMENTS 5,121,006  6/1992  Pedersen .................................. 326/38
5,352,940  10/1994 Watson ............................... 365/189.08
5,457,408  10/1995 Leung ....................................... 326/38

FOREIGN PATENT DOCUMENTS

WO94/10754  11/1993  WIPO .

OTHER PUBLICATIONS

Betty Prince, "Semiconductor Memories", copyright 1983, 1991, John Wiley & Sons, pp. 149–174.

*Primary Examiner*—David C. Nelms
*Assistant Examiner*—Huan Hoang
*Attorney, Agent, or Firm*—Edel M. Young; Adam H. Tachner

[57] ABSTRACT

In an FPGA having registers which are part of a user's logic functions and a configuration memory which is read and written through an addressing structure, a register protect circuit controllably protects the contects of these user logic registers from being modified by signals from the user's logic, allows these registers to be written by a microprocessor through the configuration memory addressing structure, and allows both the user's registers and lines which provide combinational signals to be read by a microprocessor through the configuration memory addressing structure.

4 Claims, 7 Drawing Sheets

REGISTER PROTECTION STRUCTURE FOR FPGA

FIELD OF THE INVENTION

The invention relates to integrated circuits, more particularly to field programmable logic devices (FPGAs) having a programmable core of logic, a configuration memory for programming the core logic, logic for programming the configuration memory, and pad drivers for interfacing to external pads and pins.

BACKGROUND OF THE INVENTION

Reprogrammable FPGAs have been available commercially for several years. The best known commercial family of FPGAs are those from Xilinx, Inc. One class of these devices uses Static Random Access Memory (SRAM) cells to hold control bits which control their configurations. Each SRAM cell controls one or more transistors at the configurable points in an FPGA or serves as one or more entries in a lookup table. (The configuration memory cells collectively determine what functions the FPGA will implement.)

The present invention will be described in connection with SRAM FPGAs. The configuration of the FPGA is typically loaded from a non-volatile configuration memory into the SRAM configuration memory cells when power is applied to the system.

Some commercially available SRAM FPGAs use data and address lines to access the configuration memory in a way similar to that used to access any random access memory. With an addressable configuration memory, an external processor can perform word-wide read or write operations on the registers of the user's design without having to re-load other parts of the configuration data. In such systems, a small portion of the configuration memory can be changed rapidly, and the remaining configuration memory may remain undisturbed. Thus the configuration memory interface allows high bandwidth (high speed) communication between the processor and the FPGA.

In present RAM addressable FPGAs some of the pins of the FPGA are dedicated to address lines, data lines, and other control lines for loading the configuration memory, while other pins are dedicated to input and output of user logic. FIG. 1 shows such an FPGA chip and the relationships between external pads, the FPGA user logic structures, and the configuration memory which configures the user logic. It is convenient to visualize the FPGA as formed in first and second stories, a first story holding the configuration information which selects the functions performed by the FPGA, and a second story which performs the function selected by the user. FIG. 1 illustrates the FPGA in this manner. (Physically, the configuration memory and the user logic are formed on the same substrate of an integrated circuit structure. This structure is described in PCT application serial No. WO 94/10754 published May 11, 1994.)

As shown in FIG. 1, some of the pads are for accessing user logic 19 and others are for addressing and loading configuration memory 25. The pad drivers 18 are configured by a user-generated enable signal to determine whether a particular user logic pad 16 is an input pad, an output pad, or unused. Switches such as switch 15 are configured by the underlying configuration memory 25 to transfer signals between the pad drivers 18 and the internal user logic 19. Such internal user logic is discussed in detail by the present inventor in Patent Cooperation Treaty patent application serial No. WO 94/10754 published 11 May 1994. Pads R0 through R3, R/W, CE, CK, RST, C0 through C2, D0 through D7 and their related pins (not shown in FIG. 1) are dedicated to the configuration function. A commercially available device typically has more pads for both configuration and user logic than shown in FIG. 1.

Configuration memory 25 is loaded by addressing a memory cell or memory word as is done in a conventional RAM. Row and column address busses 22 and 27 carry address signals which are decoded by row and column decoders 21 and 26, and connect a selected word of configuration memory 25 to configuration data bus 23 to be read or written. Pads D0 through D7 are coupled to configuration data bus 23.

FIG. 2 shows the relationship between the address and data busses, the row and column decode structures, the eight bit drivers associated with each word, and the data locations in the configuration memory array 25. Such structures are well known in the art. Betty Prince in "Semiconductor Memories"© 1983, 1991 by John Wiley & Sons discusses such structures at pages 149–174.

Also shown in FIG. 1 is memory load control unit 24. Control unit 24 enables row and column decoders 21 and 26 in response to well known clock, chip enable, and reset signals from pads CE, CK, and RST respectively. Memory control unit 24, in response to a read/write signal on pad R/W, determines whether pads D0 through D7 will have an input configuration for writing or an output configuration for reading data bus 23.

If the structure of FIG. 1 is to be reconfigured or partially reconfigured during operation, an external device such as a microprocessor addresses portions of the configuration memory and loads new data into those locations.

In some FPGAs, the logic available to a user in the FPGA includes both combinational logic which may implement a user-selected function, and registers which the user may store values. Thus the FPGA includes many configuration memory cells (which may be flip flops or latches) and some user logic registers (which are usually flip flops).

The user may wish to read and write the user logic registers directly, for example from a microprocessor, especially when debugging a design. Or the user may wish to reserve certain registers for loading data from an external position and not allow these registers to be written from internally generated values.

SUMMARY OF THE INVENTION

The present invention allows a user to protect selected registers from being written from internal logic and in one embodiment protects registers from being cleared when a global clear signal is asserted. The invention also allows registers and combinational logic signal lines which are part of the user's logic in the FPGA to be read from external pins.

According to the invention, memory cells are included in the configuration logic which can be set by the user to prevent a combinational output signal available as a register input signal from being loaded into the register. In one embodiment a multiplexer replaces the combinational signal input to the register with the Q output of the register so that the combinational signal can not replace the register value.

Also according to the invention, some of the bit and word lines used to address and load bits in the configuration memory are also used to address and load bits in the user's registers or read output signal lines from the user's combinational logic. These word and bit lines can access a register when it is in a mode of being protected from being written from the user's logic.

A useful feature of the register protect structure is that an external device may "take a snapshot" of the registers in the FPGA, by reading out all register values at a selected point in time, then the FPGA may perform unrelated operations, after which all register values present in the snapshot are loaded back into the FPGA and the FPGA continues from where the snapshot was taken.

DETAILED DESCRIPTION OF SOME EMBODIMENTS OF THE INVENTION

Figure 1:
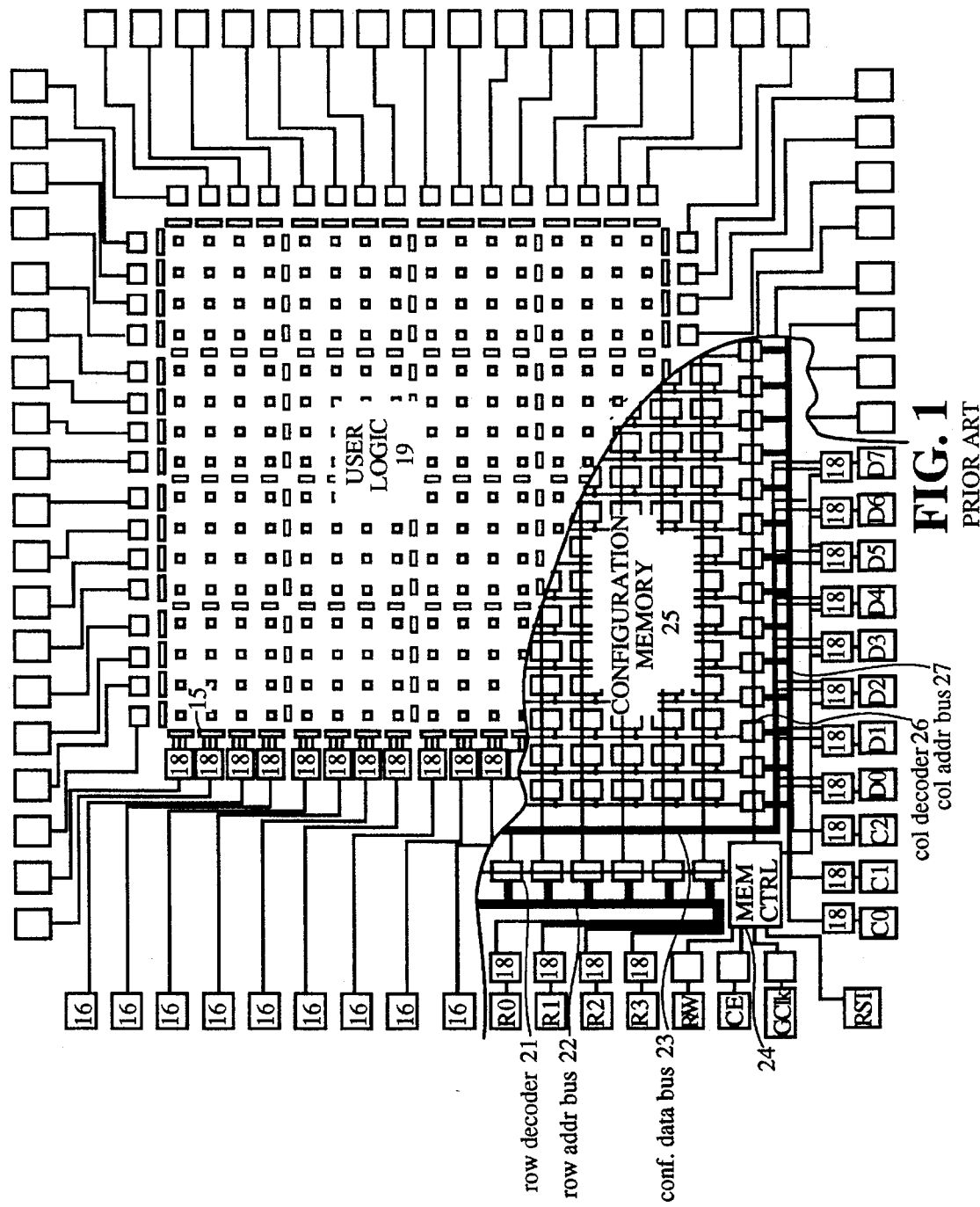
FIG. 1 shows one FPGA chip and the relationships between external pads, the FPGA user logic structures and the configuration memory which configures the user logic.
Figure 2:
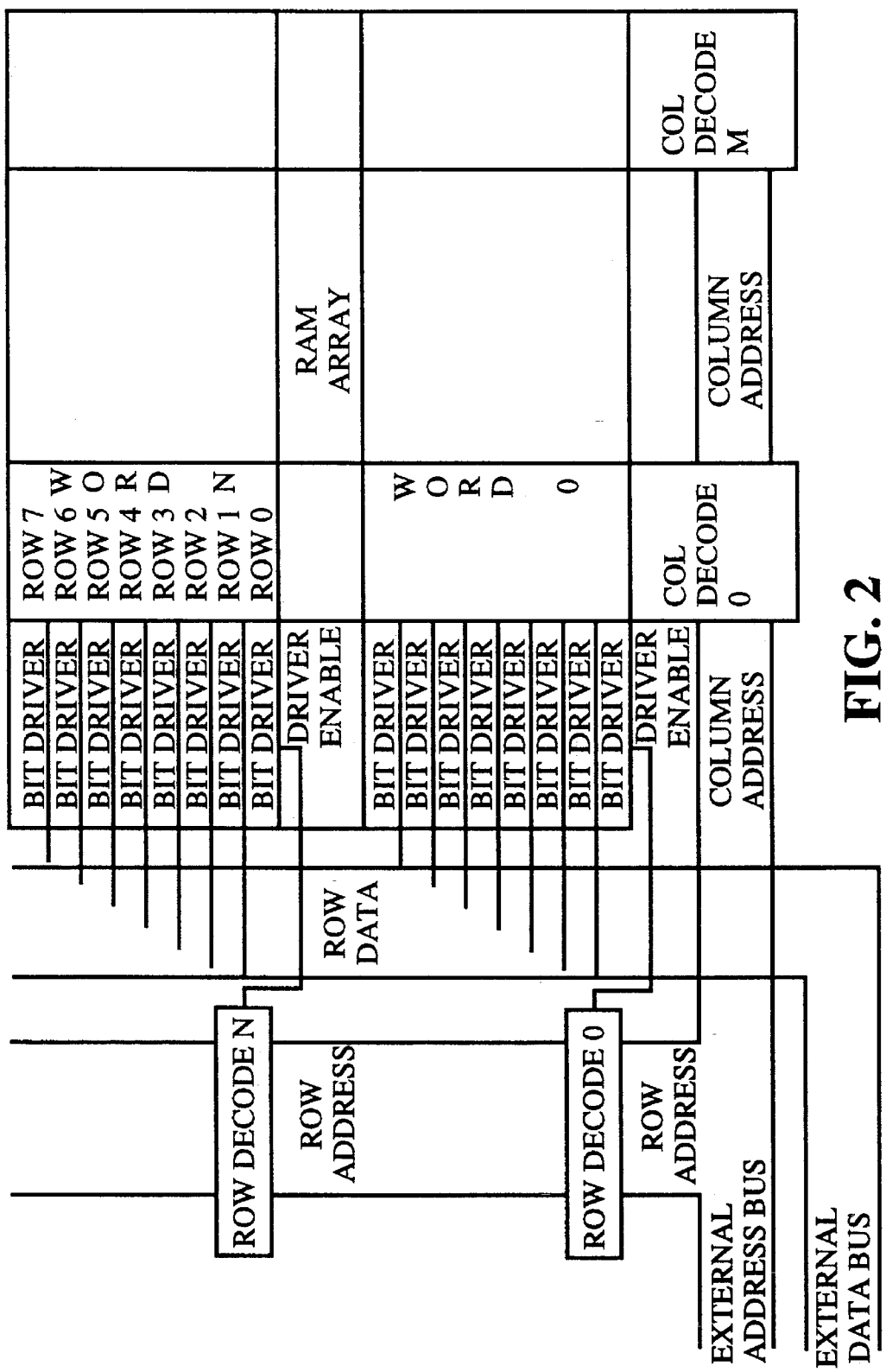
FIG. 2 shows the row and column address structure of the circuit of FIG. 1.
Figure 3:
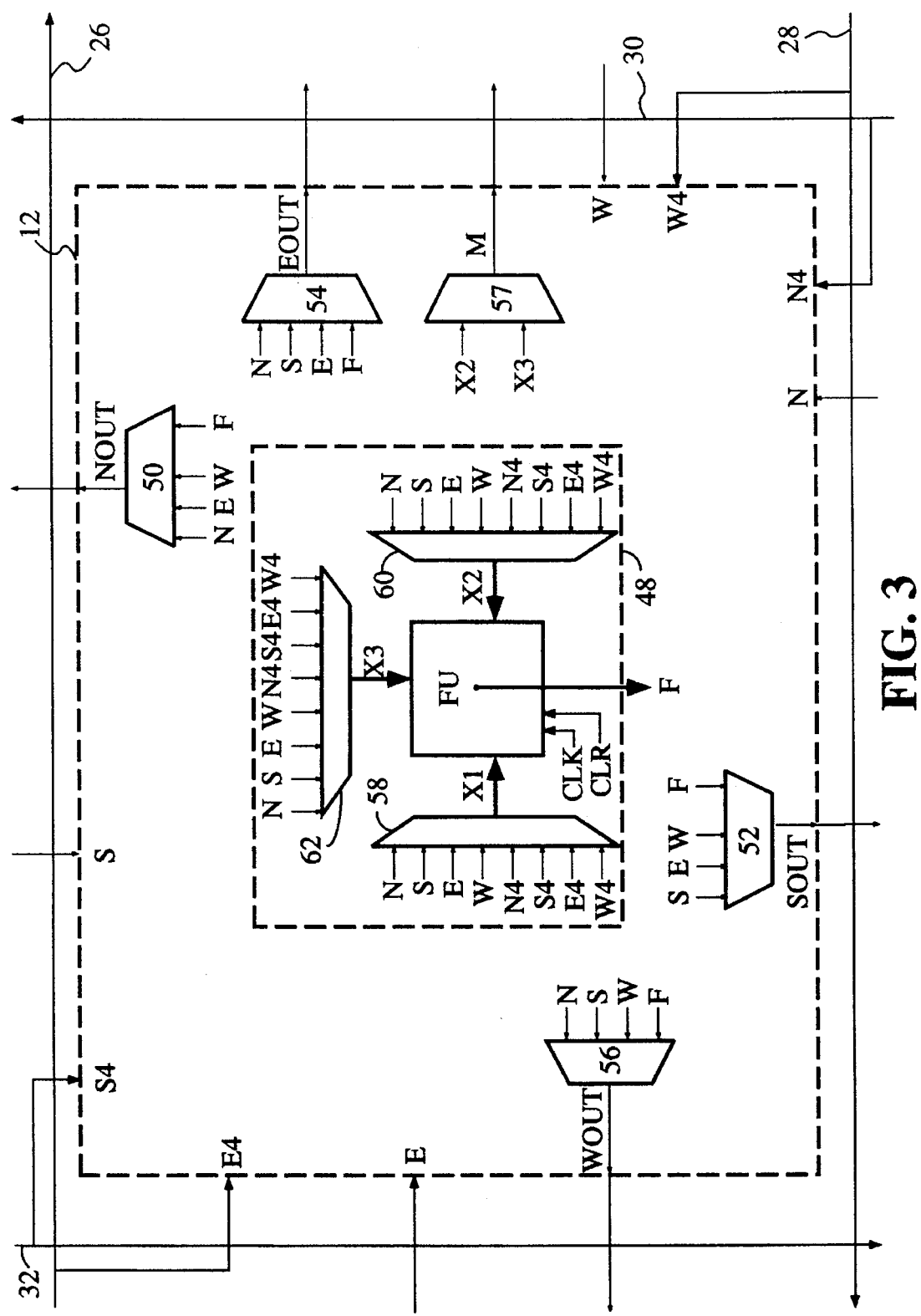
FIG. 3 shows a logic cell of the type which may be used with the present invention.

FIG. 3 shows a logic cell with which the present invention can operate. Three input multiplexers 58, 60, and 62 provide a selected input signal X1, X2, and X3 to function unit FU. Four output multiplexers 50, 52, 54, and 56 provide output signals going north, south, east, and west respectively. These output signals are derived from input signals from north, south, east and west as shown in FIG. 3 and also from the signal F, which is the output signal from function unit FU. Multiplexer 57 provides as an output signal the X2 or X3 signal and thus allows a signal coming in on one of the length-one or length-four lines of a hierarchical interconnect structure to be provided as an output signal M.

Register Protect Structure

Figure 4:
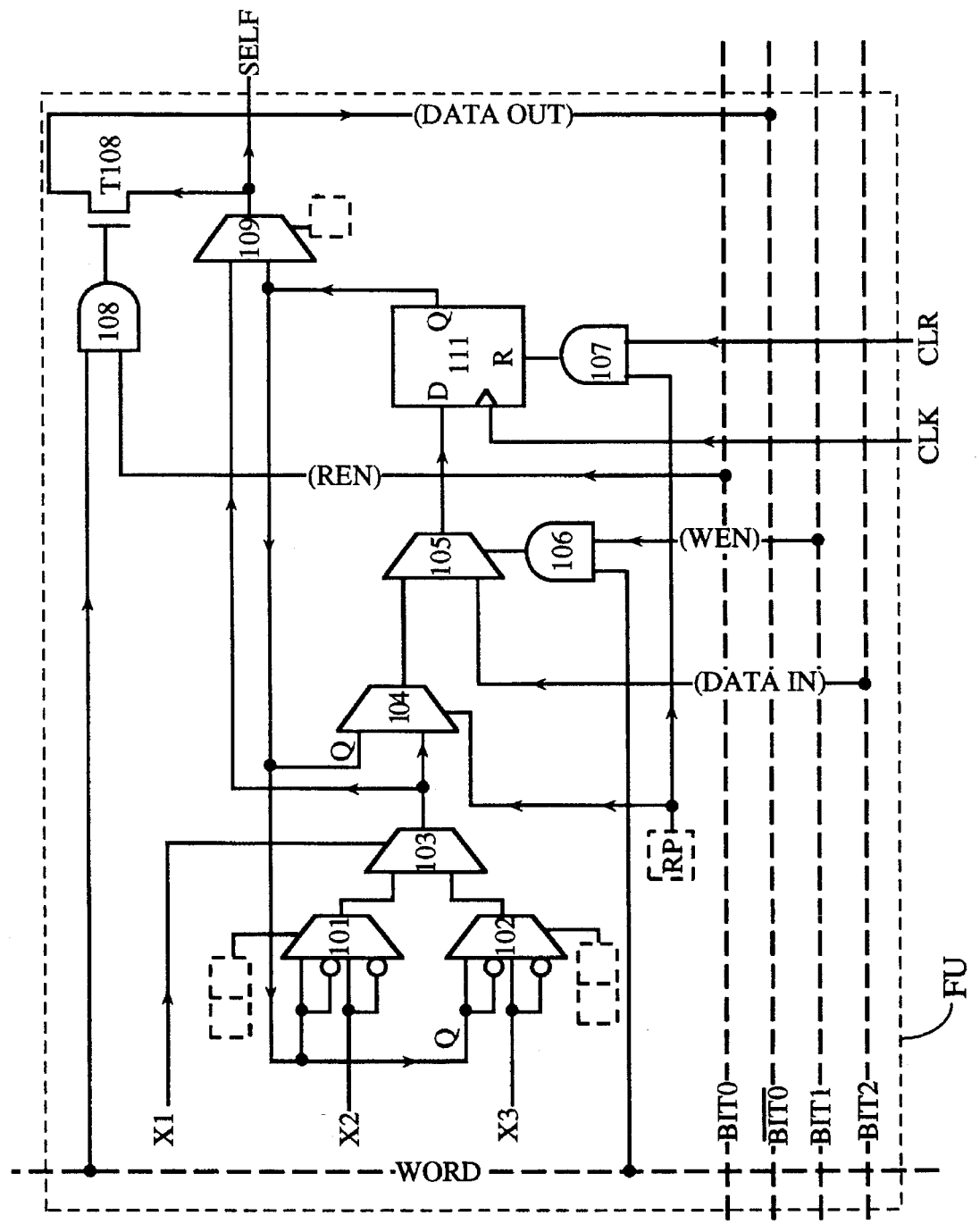
FIG. 4 shows a novel function unit which may operate in the logic cell of FIG. 3.

As shown in FIG. 4, another feature of function unit FU achieves an important advantage. As discussed above, input signals X1, X2, and $\overline{X3}$ are generated by user logic. Lines WORD, BIT0, $\overline{BIT0}$, BIT1 and BIT2, are part of the configuration memory programming structure for reading and writing the memory cells in the configuration memory, and these lines can also be used to read and write registers 111 which are part of the user logic. A register protect multiplexer 104 can be programmed to select whether a signal from the user logic or a signal from the structure which controls configuration memory will be allowed to write to register 111. When register protect bit RP in configuration memory is logical zero, the combinational output from multiplexer 103 is forwarded to multiplexer 105 and can be loaded into register 111 in response to clock signal CLK. When the register protect bit RP is logical one, the Q output signal from register 111 is provided as input to multiplexer 105, which provides the D input to register 111. Thus the user logic, which generates the output signal from multiplexer 103 can not change the value in register 111. Even the clear signal CLR will not clear those registers which have their register protect bit RP set. In this mode, configuration memory access signals on lines WORD, BIT0, $\overline{BIT0}$, BIT1 and BIT2, can be used both to read and to write register 111. Thus an external CPU can have access to these registers while other portions of the FPGA are performing other functions and registers are being cleared with a global clear signal. Multiplexer 109, which receives both the combinational and sequential outputs of function unit FU allows an external CPU or other device to access the combinational output of multiplexer 103 as well as the output of register 111.

Connecting the WORD, BIT0, $\overline{BIT0}$, BIT1 and BIT2 lines to provide signals through the programmable switches to the user logic allows the user logic to detect and act on register accesses which are made through the configuration memory addressing structure.

Snapshot Feature

In some applications it is desirable to be able to take a snapshot of the state of an FPGA comprising both configuration information and the state of registers, save this snapshot in external memory, re-configure the FPGA to perform another task and then restore the snapshot of the state of the FPGA from the external memory so that the FPGA logic can start from where it left off. This is analogous to 'swapping in' and 'swapping out' a process on a conventional computer which has a multi-process operating system. So the term 'swapping out' can be used for saving the snapshot and 'swapping in' for restoring it. To make the snapshot feature possible when there is a register protect multiplexer 104 in every cell, it is necessary to be able to stop the Global Clock signal (GCLK) to the user logic without stopping the clock to the processor interface. In addition, all registers in the user logic must be clocked from GCLK and there must be no registers or latches built from gates in the user logic. It is necessary to turn off GCLK to the user logic because it will take many processor cycles to read the entire device state. If GCLK was not turned off some state information would change during the read process and the saved values would not reflect a single clock cycle 'snapshot' of the user register states. Reads to registers and configuration memory locations can take place with the user logic clock off.

Figure 5:
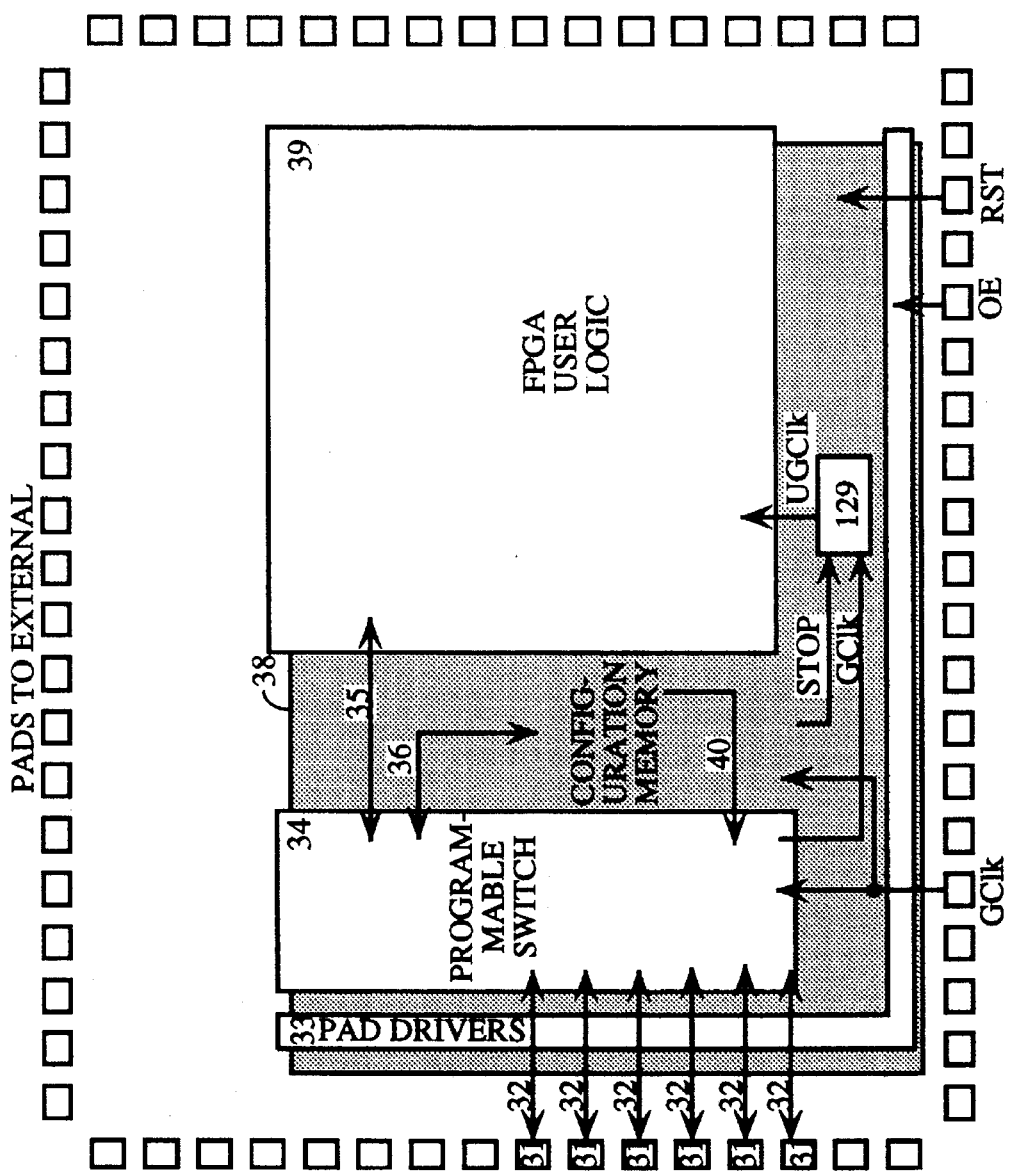
FIG. 5 illustrates a structure which provides a global clock signal from an external pad to a programmable switch and further provides the global clock signal to a gating device.
Figure 6:
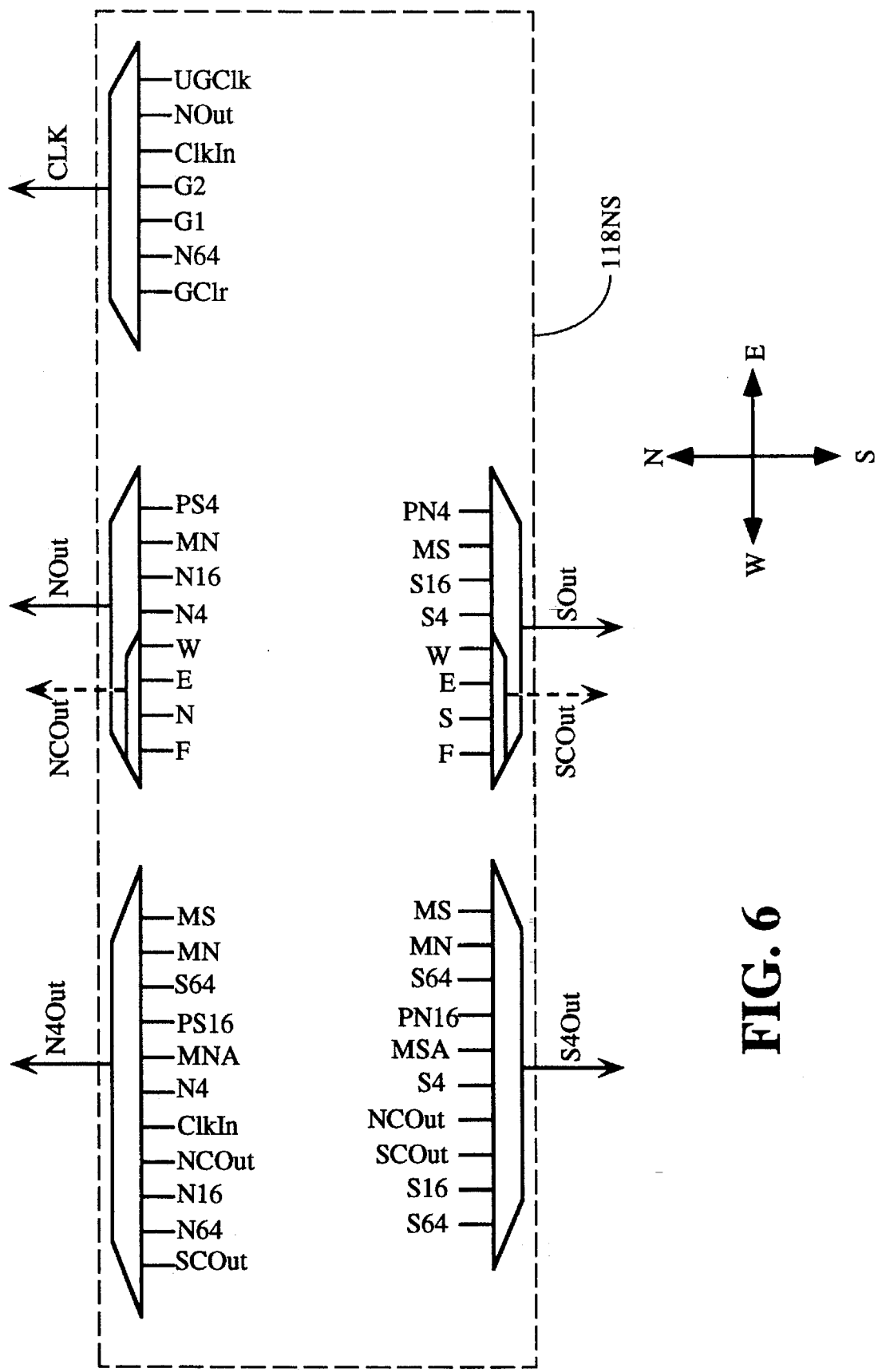
FIGS. 6 and 7 illustrate switches provided in one embodiment at locations throughout the user logic structure.
Figure 7:
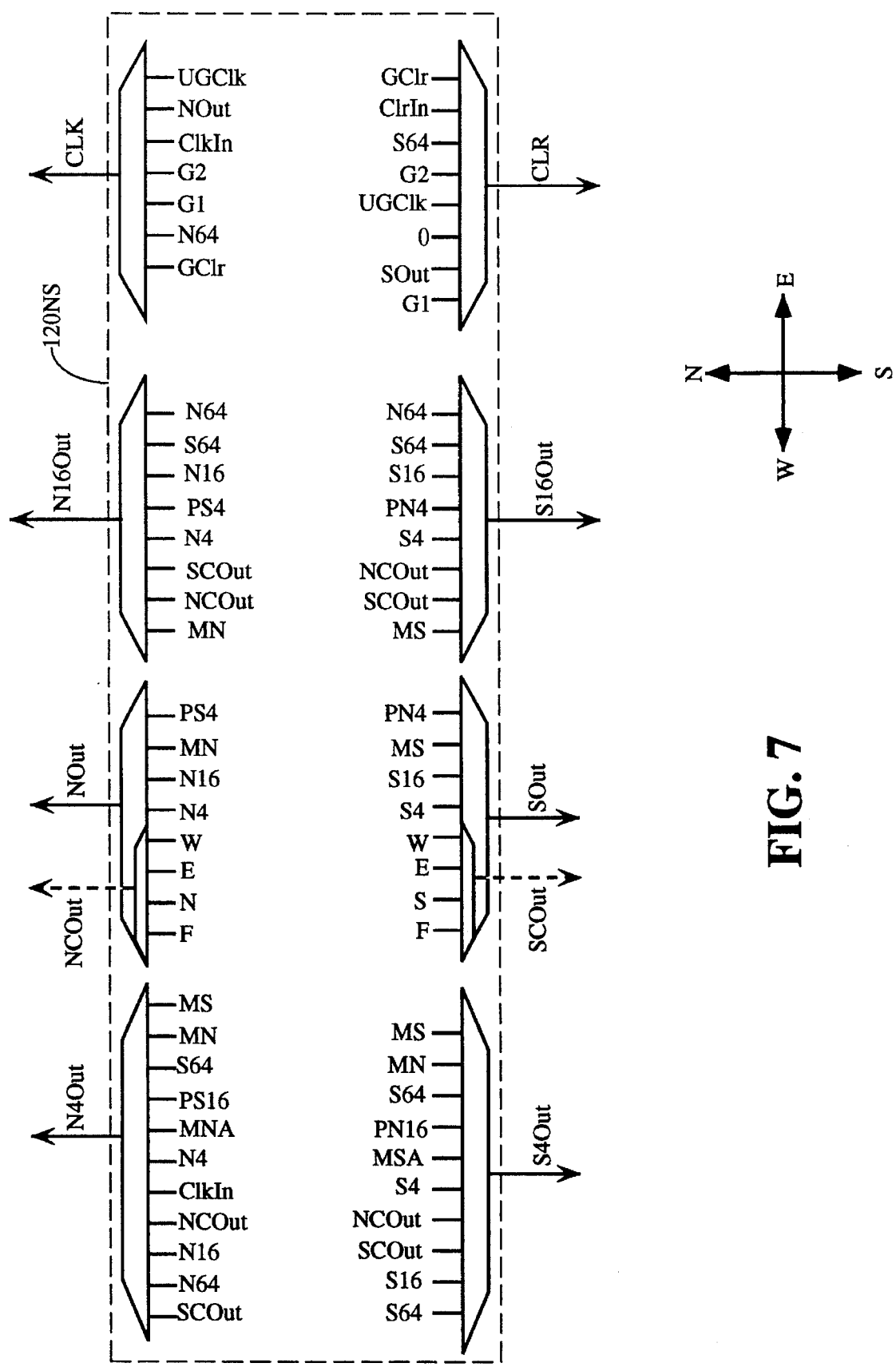

Thus a gated version of the global clock UGClk for driving user logic is provided. Stopping and starting UGCLK to the array must be done cleanly so that no spurious short pulses are produced. Circuits for doing this are well known in the art, and are not described here. In FIG. 5 the global clock signal GClk is provided to a gating structure 129, which generates a global user clock signal UGClk if the STOP signal is not asserted. This signal UGClk is shown in FIGS. 6 and 7 as a selectable source for the clock signal CLK which drives user registers shown in FIG. 4.

The following steps accomplish the Snapshot Feature:

Swapping Out

1. Turn off UGClk to the array.
2. Read configuration and state information through the configuration memory interface structure. The portion of configuration memory interface for reading state information to or from one user logic cell is shown in FIG. 4.

Swapping In

1. Set all RP=TRUE (configure memory to protect all registers). Setting all RP=TRUE can be done with one write cycle for the whole chip or a small number of write cycles for a given sub-area of the chip by using the wildcard addressing feature described in PCT application WO 94/10754. UGClk can be enabled or disabled because the values in the registers are to be overwritten.

2. Turn UGClk on. UGClk must be running to allow writes to registers since values are clocked into registers on the rising edge of CLK which is derived from UGClk.

3. Load register state through configuration memory interface. Even though UGClk is running, the register state will not be overwritten by user logic signals because register protect is set. Thus, although many clock cycles may be required to load the registers the registers will eventually hold the correct values for the swapped out states.

4. Turn UGClk off. Writes to configuration memory do not require UGClk to the array to be running. Turning off UGClk assures that register states will not be changed even though as the correct configuration is loaded many registers will have their register protect turned off.

5. Program the configuration memory.

6. Turn UGClk on.

Logic in the FPGA starts off with the previously swapped out configuration and state.

Thus, in an FPGA having registers which are part of a user's logic functions and a configuration memory which is read and written through an addressing structure, a register protect circuit controllably protects these user logic registers from being written by signals from the user's logic, allows these registers to be written by a microprocessor through the configuration memory addressing structure, and allows both the user's registers and lines which provide combinational signals to be read by a microprocessor through the configuration memory addressing structure.

Though only specific embodiments of the present invention have been described here in detail, other embodiments will become obvious to those skilled in the art in light of the above description, and are intended to fall within the scope of the present invention.

We claim:

1. A register protect structure comprising:

a register having a data input terminal for receiving an input signal D, a register output terminal for providing a register output signal Q, and a clock input terminal;

means for generating a user logic signal;

means for accessing said register input terminal and register output terminal through configuration memory accessing lines;

means for selecting said input signal D from any one of said user logic signal, said configuration memory accessing lines, and said register output signal Q; and register protect means for preventing said user logic signal from being selected by said means for selecting.

2. A register protect structure as in claim 1 in which said register further has a clear input terminal for clearing said output signal Q in response to a clear signal.

3. A register protect structure as in claim 2 further comprising:

means for preventing said clear signal from being passed to said clear input terminal.

4. A register protect structure comprising:

a register having a data input terminal for receiving an input signal D, a register output terminal for providing a register output signal O, a clock input terminal, and a clear input terminal for clearing said output signal O in response to a clear signal;

means for generating a user logic signal;

means for accessing said register input terminal and register output terminal through configuration memory accessing lines;

means for selecting said input signal D from any of said user logic signal, said configuration memory access lines, and said register output signal O; and register protect means for preventing said user logic signal from being selected by said means for selecting;

means for preventing said clear signal from being massed to said clear in terminal, said means for preventing said clear signal from being passed to said clear input terminal comprising a logic gate which receives both said clear signal and a signal from said register protect means and passes said clear signal to said clear input terminal only when said signal from said register protect means is not asserted.

* * * * *

UNITED STATES PATENT AND TRADEMARK OFFICE
CERTIFICATE OF CORRECTION

PATENT NO.  : 5,600,597
DATED       : February 4, 1997
INVENTOR(S) : Thomas A. Kean and William A. Wilkie It is certified that error appears in the above-identified patent and that said Letters Patent is hereby corrected as shown below:

Col. 6, Claim 4, line 21, "signal O" should read --signal Q--.

Col. 6, Claim 4, line 22, "signal O" should read --signal Q--.

Col. 6, Claim 4, line 31, "signal O" should read --signal Q--.

Col. 6, Claim 4, line 34, "massed" should read --passed--.

Signed and Sealed this

Twenty-fourth Day of March, 1998

*Attest:*

BRUCE LEHMAN

*Attesting Officer*    *Commissioner of Patents and Trademarks*